(12) United States Patent
Westmarland et al.

(10) Patent No.: US 11,848,257 B2
(45) Date of Patent: Dec. 19, 2023

(54) BENDING SEMICONDUCTOR CHIP FOR CONNECTION AT DIFFERENT VERTICAL LEVELS

(71) Applicant: Infineon Technologies AG, Neubiberg (DE)

(72) Inventors: Paul Westmarland, Surrey (GB); Stuart Cardwell, Crowborough (GB)

(73) Assignee: Infineon Technologies AG, Neubiberg (DE)

(*) Notice: Subject to any disclaimer, the term of this patent is extended or adjusted under 35 U.S.C. 154(b) by 72 days.

(21) Appl. No.: 17/411,633

(22) Filed: Aug. 25, 2021

(65) Prior Publication Data

US 2022/0068775 A1    Mar. 3, 2022

(30) Foreign Application Priority Data

Aug. 31, 2020   (DE) .................. 10 2020 122 662.4

(51) Int. Cl.
*H01L 23/495* (2006.01)
*H01L 23/31* (2006.01)

(52) U.S. Cl.
CPC .... *H01L 23/49575* (2013.01); *H01L 23/3107* (2013.01); *H01L 23/49562* (2013.01); *H01L 23/49568* (2013.01)

(58) Field of Classification Search
CPC .......... H01L 23/49575; H01L 23/3107; H01L 23/49562; H01L 23/49568

USPC ......................................................... 257/666
See application file for complete search history.

(56) References Cited

U.S. PATENT DOCUMENTS

| | | |
|---|---|---|
| 6,723,620 B1 | 4/2004 | Pavier |
| 9,607,968 B1* | 3/2017 | Jeong ................. H01L 24/73 |
| 10,692,836 B2 | 6/2020 | Pendse |
| 2013/0037917 A1 | 2/2013 | Xue |
| 2013/0148314 A1 | 6/2013 | Hirai et al. |
| 2013/0334680 A1 | 12/2013 | Boone et al. |
| 2016/0083248 A1 | 3/2016 | Xu |
| 2017/0309548 A1* | 10/2017 | Arrigoni ............ H01L 21/4825 |
| 2018/0211943 A1 | 7/2018 | Song et al. |
| 2019/0132983 A1* | 5/2019 | Weis .................. H01L 24/82 |
| 2020/0058571 A1* | 2/2020 | Wang ................ H01L 23/433 |

FOREIGN PATENT DOCUMENTS

JP      2018-200205    12/2018

* cited by examiner

*Primary Examiner* — Kimberly N Rizkallah
*Assistant Examiner* — Dilinh P Nguyen
(74) *Attorney, Agent, or Firm* — Dicke, Billig & Czaja, PLLC

(57) ABSTRACT

A package is disclosed. In one example, the package comprises a carrier, a semiconductor chip having a first connection area at which the semiconductor chip is mounted at a first vertical level on or above the carrier, and a connection body. The semiconductor chip is bent to thereby be connected at a second connection area of the semiconductor chip at a second vertical level, being different from the first vertical level, with the connection body.

18 Claims, 4 Drawing Sheets

BENDING SEMICONDUCTOR CHIP FOR CONNECTION AT DIFFERENT VERTICAL LEVELS

CROSS-REFERENCE TO RELATED APPLICATION

This Utility patent application claims priority to German Patent Application No. 10 2020 122 662.4, filed Aug. 31, 2020, which is incorporated herein by reference.

BACKGROUND

Various embodiments relate generally to a package and a method of manufacturing a package.

Packages may be denoted as encapsulated semiconductor chips with electrical connects extending out of the encapsulant. For example, packages may be connected to an electronic periphery, for instance mounted on a printed circuit board, or mounted onto a heatsink and connected via connectors to a larger system.

Packaging cost is an important driver for the industry. Related with this are performance, dimensions and reliability. The different packaging solutions are manifold and have to address the needs of a specific application.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION

Figure 1:
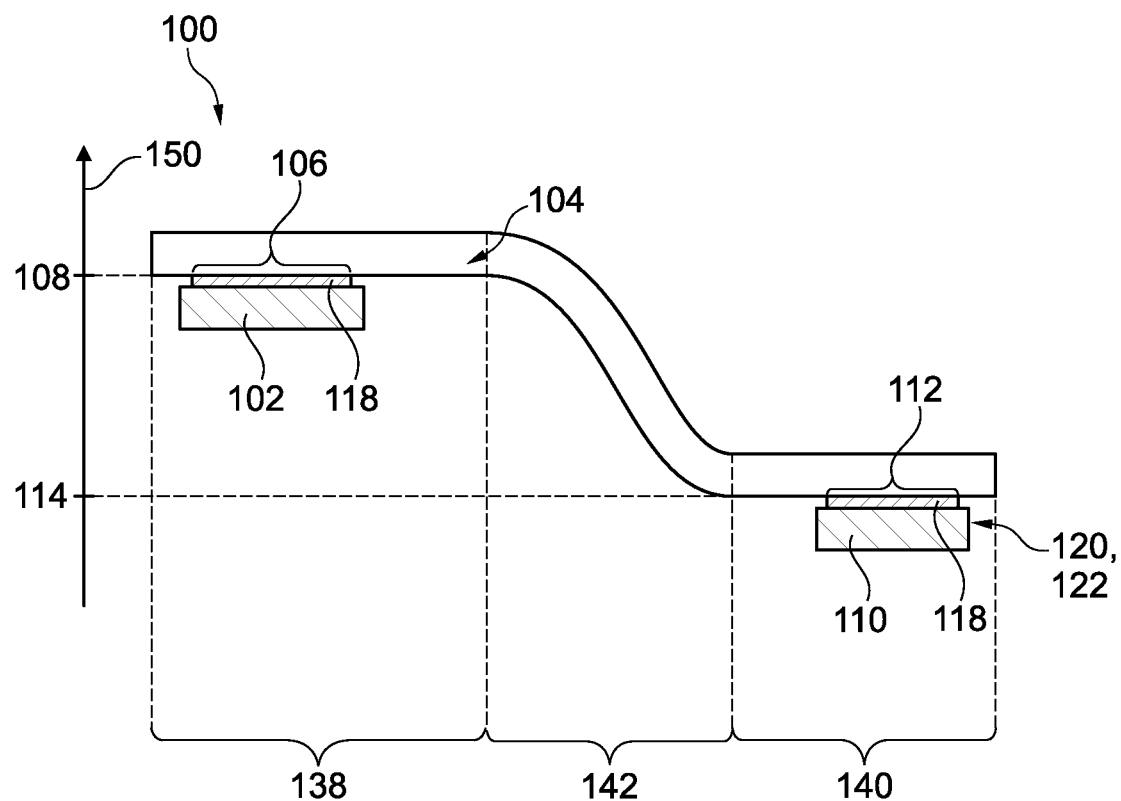
FIG. 1 illustrates a cross-sectional view of a package according to an exemplary embodiment.

There may be a need to provide a possibility to package a semiconductor chip in a simple and compact way.

According to an exemplary embodiment, a package is provided which comprises a carrier, a semiconductor chip having a first connection area at which the semiconductor chip is mounted at a first vertical level on or above the carrier, and a connection body, wherein the semiconductor chip is bent (or flexed) to thereby be connected at a second connection area of the semiconductor chip at a second vertical level, being different from the first vertical level, with the connection body.

According to another exemplary embodiment, a method of manufacturing a package is provided, wherein the method comprises mounting a semiconductor chip having a first connection area at a first vertical level on or above a carrier, and bending (or flexing) the semiconductor chip to thereby connect the semiconductor chip at a second connection area of the semiconductor chip at a second vertical level, being different from the first vertical level, with a connection body.

According to an exemplary embodiment, a package is provided in which a flexible or bendable semiconductor chip, thanks to its small thickness and/or bendable or flexible material, is treated for creating a curvature of the semiconductor chip in at least one bent portion so that different connection areas of the semiconductor chip can bridge a height difference via the at least one bent portion. Consequently, the bent semiconductor chip can be connected at different height levels with a carrier on the one hand and with another connection body on the other hand, and optionally with at least one further connection body. By taking this measure, any conventional measures for bridging a height difference between a semiconductor chip and an entity to be connected therewith can be advantageously avoided (for instance a clip, a bond wire or the like) at least partially. What concerns semiconductor chips, such an approach has been impossible in the past due to the involved conventionally high thicknesses. However, with the advent of extremely thin semiconductor chips or the like, such a bending or flexing has become possible and can be highly advantageously used according to an exemplary embodiment for bridging a vertical height difference within a package in a simple way. As a result, a highly compact package may be obtained which can be manufactured with low effort. At the same time, the direct coupling using a curved semiconductor chip may shorten electric paths which may result in lower losses and/or higher quality of signal transmission. Hence, a package with improved performance may be obtained.

In the following, further exemplary embodiments of the package and the method will be explained.

In the context of the present application, the term "package" may particularly denote an electronic device which may comprise one or more semiconductor chips mounted on a carrier, said carrier to comprise or consist out of a single part, multiple parts joined via encapsulation or other package components, or a subassembly of carriers. Said constituents of the package may be optionally encapsulated at least partially by an encapsulant.

In the context of the present application, the term "semiconductor chip" may in particular encompass a body comprising a semiconductor material, such as a power semiconductor chip, an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). In particular, the semiconductor chip may have at least one integrated circuit element (such as a diode or a transistor) in a surface portion thereof. The semiconductor chip may be a naked die or may be already packaged or encapsulated. Semiconductor chips implemented according to exemplary embodiments may be formed in silicon technology, gallium nitride technology, silicon carbide technology, etc.

In the context of the present application, the term "carrier" may particularly denote a support structure (preferably, but not necessarily electrically conductive) which serves as a mechanical support for the one or more semiconductor chips, and which may also contribute to the electric interconnection between the semiconductor chip(s) and the periphery of the package. In other words, the carrier may fulfil a mechanical support function and an electric connection function. A carrier may comprise or consist of a single part, multiple parts joined via encapsulation or other package components, or a subassembly of carriers.

In the context of the present application, the term "connection area" may particularly denote a surface area portion of the semiconductor chip at which the semiconductor chip is connected, for instance directly or via a connection medium such as solderable material, with another entity, in particular a carrier, a further electronic component, or any other connection body. For instance, the connection area may correspond to an electrically conductive pad (or the like) of the semiconductor chip at which not only a mechanical connection but additionally an electric connection between the semiconductor chip on the one hand and the connection body or the carrier on the other hand may be established.

In the context of the present application, the term "vertical level" may particularly denote a height level of the package, in particular in accordance with a vertical direction oriented in an upward direction from a for instance substantially planar carrier. A stacking or assembly of constituents of the package may be carried out starting from a bottom side up to a top side of the package along a vertical direction defining said vertical levels.

In the context of the present application, the term "connection body" may particularly denote any physical structure to which the semiconductor chip is connected, directly or indirectly. For instance, such a connection body may be an electrically conductive lead (which may for instance form part of a leadframe, more particularly also comprising the carrier), another electronic component, or any other body such as a further carrier or a clip.

In the context of the present application, the term "bent" or "bending" may particularly refer to a flexing or deformation of the semiconductor chip for establishing a curvature of the semiconductor chip in one or more bent or flexed portions of the semiconductor chip. For instance, the semiconductor chip may be planar in a force free state and may be re-shaped by applying bending strain by forcing a connection at its connection areas. In particular, bending of the semiconductor chip may be accomplished for bridging a vertical height level difference between the first connection area and the second connection area. Such a bending or flexing of the semiconductor chip may be carried out by creating an elastic or an inelastic deformation of the semiconductor chip. Hence, bending a semiconductor chip may be carried out by applying mechanical stress to the semiconductor chip. In the presence of the applied stress, respective connection areas may then be fixed with a connected entity (such as carrier or connection body), for instance by soldering. In particular, a semiconductor chip being planar in a force free state may be bent in one or multiple bending portions thereof for connecting the semiconductor chip at two or more connection areas thereof.

An idea of an exemplary embodiment may be to provide a package using flexible properties of a semiconductor chip (in particular secondary flexible properties of a very thin silicon die) to make a connection to a carrier (such as a die pad of a leadframe) or another connection body (such as another die) in a different geometric plane. More particularly, it may be possible to use flexible properties of a thin die-type semiconductor chip to create highly advantageous packaging geometries. More specifically, exemplary embodiments may reduce package size and increase power density of packages. In particular, it may be possible to provide a low on-resistance package, for instance in a half-bridge configuration. Apart from this, it may also be possible to form significantly shorter paths for connections between semiconductor chips (such as an integrated gate bipolar transistor (IGBT) and a diode), so that it may be possible to efficiently suppress a source of unwanted inductance.

In an embodiment, the package comprises a further electronic component (such as a further semiconductor chip) arranged (in particular sandwiched) between the carrier and the semiconductor chip. More specifically, the further electronic component may be for example an active semiconductor component, in particular one of a transistor, a diode, a bipolar transistor, and an insulated gate bipolar transistor. In such an embodiment, the aforementioned semiconductor chip and said further electronic component may be vertically stacked so that the aforementioned semiconductor chip is vertically spaced with respect to the carrier on which the further electronic component may be directly mounted (for instance soldered). As a result, a height difference between the aforementioned semiconductor chip and the carrier occurs due to the further electronic component in between. In order to nevertheless contact the spaced semiconductor chip with a connection body, which may be arranged for instance at the same height level as the carrier (for instance since it forms part of the same planar patterned metal plate, such as a leadframe), bending of the upper semiconductor chip may be carried out for bridging the created height distance with low effort.

In an embodiment, the package comprises an electrically conductive connection structure, in particular a solder structure, between the semiconductor chip and the further electronic component. In such an embodiment, the two mentioned electronic components or semiconductor chips may be mechanically, and preferably also electrically, interconnected by the electrically conductive connection structure directly in between. This may for example also create a direct electric path from a bottom main surface of the upper semiconductor chip and an upper main surface of the lower electronic component. When the electronic components/semiconductor chips cooperate functionally (for instance are a processor and a memory chip, two cooperating memory chips, or a sensor chip and a controller chip) such a direct connection between the opposing main surfaces of the electronic components/semiconductor chips may be highly advantageous. This may result in short electric signal paths, resulting in low loss and high signal quality. A direct stacking combined with a direct electric coupling of the electronic components/semiconductor chips may be particularly advantageous when the electronic components/semiconductor chips experience a vertical current flow during operation of the package. As an alternative to soldering, the electrically conductive connection structure may also create a sinter connection, a welding connection or an adhesive connection between the stacked electronic components/semiconductor chips.

In particular, the electrically conductive connection structure may be configured for electrically coupling facing pads of the semiconductor chip and of the further electronic component. Thereby, a direct vertical functional coupling between the main surfaces of the electronic components/semiconductor chips facing each other may be established.

In an embodiment, the semiconductor chip and the further electronic component are interconnected to form a half-bridge. In such a half-bridge configuration, the two electronic components/semiconductor chips may be field effect transistor chips which may be interconnected for power semiconductor applications such as switching applications. For example, such a half-bridge may be a constituent of an inverter or a six pack.

In an embodiment, the semiconductor chip and the further electronic component are transistor chips, in particular metal oxide semiconductor field effect transistor (MOSFETs) chips. When embodied as transistor chips, the electronic components/semiconductor chips may for instance be MOSFET or IGBT (insulated gate bipolar transistor) chips. Such transistor chips may be used as constituents of power semiconductor packages.

In an embodiment, one of the semiconductor chip and the further electronic component is a transistor chip, in particular an insulated gate bipolar transistor chip (IGBT), and the other one of the semiconductor chip and the further electronic component is a diode chip. Such a combination of a transistor chip and a diode chip may also fulfil electronic needs in power semiconductor technology.

In an embodiment, the connection body comprises an electrically conductive structure, in particular one of a lead, a pad, and a section of a leadframe. In such an embodiment, the connection between the bent semiconductor chip and the connection body may establish a further electrically conductive connection. Preferably, the carrier may be a die pad and the connection body may be a lead of a common leadframe structure or any other patterned planar metal sheet.

In another embodiment, the connection body comprises yet another electronic component. Thus, bridging a height difference between two electronic components/semiconductor chips by bending at least one of said electronic components/semiconductor chips may be used for creating a component-component connection by flexing. This may be accomplished in particular so that a vertical gap between the lower main surface of one of the electronic components/semiconductor chips and the upper main surface of the other one of the electronic components/semiconductor chips is bypassed by bending one or both of said electronic components/semiconductor chips.

In an embodiment, a thickness of the bent or flexed semiconductor chip is below 100 μm, in particular below 50 μm, more particularly not more than 20 μm. It has turned out that in particular with the mentioned thickness values, semiconductor chips and in particular silicon chips show sufficient elasticity and bendability for creating a permanently bent configuration of a fixed semiconductor chip in a package. In particular when the thickness of the semiconductor chip is less than 50 μm, bendability may be so pronounced that a package with a high mechanical and electrical reliability may be created with a bent semiconductor chip being mounted with permanent flexural strain.

In an embodiment, the carrier and the connection body are coplanar. In other words, the carrier and the connection body may be located in the same plane and at the same vertical height level, in particular what concerns their respective upper main surfaces. Such a scenario may be present for example when the carrier and the connection body form part of a common planar patterned metal plate, such as a leadframe. Establishing a further electric connection between the bent semiconductor chip and the connection body in addition to the electric connection between the carrier and the semiconductor chip may be highly advantageous, in particular when a further member (such as a further electronic component) is sandwiched between the carrier and the aforementioned semiconductor chip.

In an embodiment, the carrier and the connection body belong to a common leadframe. Such a leadframe may comprise a die pad and a plurality of leads. Such a leadframe may be a sheet-like metallic structure which can be patterned so as to form one or more die pads or mounting sections for mounting the one or more semiconductor chips of the package, and one or more lead sections for an electric connection of the package to an electronic environment when the semiconductor chip(s) is/are mounted on the leadframe. In an embodiment, the leadframe may be a metal plate (in particular made of copper) which may be patterned, for instance by stamping or etching. Forming the chip carrier as a leadframe is a cost-efficient and mechanically as well as electrically advantageous configuration in which a low ohmic connection of the at least one semiconductor chip can be combined with a robust support capability of the leadframe. Furthermore, a leadframe may contribute to the thermal conductivity of the package and may remove heat generated during operation of the semiconductor chip(s) as a result of the high thermal conductivity of the metallic (in particular copper) material of the leadframe. A leadframe may comprise for instance aluminium and/or copper. Preferably, the described embodiment may combine leadframe mounting technology with the possibility of stacking semiconductor chips of a package.

In another embodiment, the carrier comprises a stack composed of a central electrically insulating and thermally conductive layer (such as a ceramic layer) covered on both opposing main surfaces by a respective electrically conductive layer (such as a copper layer or an aluminium layer, wherein the respective electrically conductive layer may be a continuous or a patterned layer), a Direct Copper Bonding (DCB) substrate, and a Direct Aluminium Bonding (DAB) substrate.

In an embodiment, the package comprises an encapsulant encapsulating at least one of at least part of the semiconductor chip, at least part of the carrier, and at least part of the connection body. In the context of the present application, the term "encapsulant" may particularly denote a substantially electrically insulating and preferably thermally conductive material surrounding at least part of a semiconductor chip and at least part of a carrier and/or a connection body to provide mechanical protection, electrical insulation, and optionally a contribution to heat removal during operation. By encapsulating in particular the bent semiconductor chip (which may hence be still under mechanical tension, even when soldered at both or all connection areas), a mechanically robust embedding of the bent semiconductor chip in the encapsulant may be achieved. Thus, encapsulation, preferably by molding, has particular advantages in terms of one or more bent semiconductor chips of the package, since this may stabilize the flexed semiconductor chip remaining under permanent bending strain within the encapsulant.

In an embodiment, the package comprises a heat removal body on the semiconductor chip, the heat removal body being exposed with respect to the encapsulant. In particular, a main surface of the semiconductor chip opposing its other main surface at which the semiconductor chip is connected with both the carrier and the connection body may be equipped with a heat removal body. Such a heat removal body may be a bulk body having a high thermal conductivity (in particular of at least 50 W/mK) which is capable of removing heat generated by the bent semiconductor chip during operation of the package. By such a heat removal, thermal stress occurring during temperature cycles or during operation of the package may be efficiently suppressed. Hence, an internal stress of the bent semiconductor chip experienced when ohmic losses or the like heat the package may be efficiently reduced by the provision of the mentioned heat removal body. Preferably, the heat removal body is exposed with respect to the encapsulant, preferably a full main surface of the heat removal body. This may further enhance the capability of the heat removal body of removing heat from an interior of the package.

In an embodiment, at least one of the carrier and the connection body is exposed with respect to the encapsulant. By exposing part of the connection body and/or part of the carrier with respect to the encapsulant (such as a dielectric encapsulant like a mold compound), the heat removal capability of the package may be further improved, and optionally also an electric coupling of the package with respect to an electronic periphery may be established by taking this measure.

In an embodiment, the package comprises a further connection body connected with the semiconductor chip. For example, such a further connection body may be a further electronic component or a further lead of a leadframe.

Still referring to the previously described embodiment, the package may comprise an electrically conductive connection element, in particular a bond wire or a clip, connecting the further connection body with the semiconductor chip. Hence, a height difference between the bent semiconductor chip and the further connection body may be bridged by wire bonding, clip assembly, or the like.

In another embodiment, the semiconductor chip is bent additionally in a second bending portion (in addition to a first bending portion used for connecting the semiconductor chip with the aforementioned connection body) to thereby be connected at a third connection area of the semiconductor chip at a third vertical level with the further connection body. Highly advantageously, the semiconductor chip may be bent in such a way that it can be connected at three vertical levels directly with three other entities, i.e. the carrier, the connection body and the further connection body. Thus, a more complex curvature of the bent semiconductor chip may create a user-definable sequence of multiple concave and/or multiple convex portions thereof. Advantageously, such a complex curvature of a bent semiconductor chip enabling a coupling of the semiconductor chip at two, three (or more) different vertical levels without the need of providing additional coupling elements such as clips or bond wires may significantly contribute to the compactness of the package and to a low loss operation.

In an embodiment, the third vertical level is different from the first vertical level and is different from the second vertical level. In such a configuration, elements at three different vertical levels may be directly connected with the semiconductor chip without additional elements in between.

In another embodiment, the third vertical level is different from one of the first vertical level and the second vertical level and is identical to the other one of the first vertical level and the second vertical level. For instance, a central vertical level of a central portion of the bent semiconductor chip may be different (in particular higher) than two exterior connection areas of the semiconductor chip being arranged at the same (in particular lower) vertical level.

In an embodiment, the above-mentioned heat removal body also connects, preferably electrically, the further connection body with the semiconductor chip. In such a configuration, the heat removal body may be embodied as a clip or any other electrically conductive and thermally conductive body. Hence, an electric connection of a bent or flexed semiconductor chip with a further connection body may synergistically create a thermally conductive connection with the bent semiconductor chip. Hence, the heat removal body may fulfil a double function of removing heat from the semiconductor chip out of the package and establishing a further electric connection path of the semiconductor chip.

In an embodiment, the semiconductor chip comprises a first planar portion mounted on or above the carrier, a second planar portion mounted on the connection body, and a slanted and/or curved portion between the first planar portion and the second planar portion. Hence, the bent semiconductor chip may be shaped as a ramp between two planar sections. It is however also possible that multiple slanted and/or multiple curved sections are foreseen at a bent semiconductor chip, wherein for instance two slanted and/or curved sections are separated by a planar section. In particular when thin silicon chips are used as semiconductor chip, they may be flexibly adapted concerning their shape by substantially any desired bending trajectory. For instance, it may be possible to first connect a first connection area of the semiconductor chip to a first connected entity such as the carrier. Thereafter, the semiconductor chip may be bent or deformed so that a second connection area thereof is connected to a second connected entity, for instance a lead. Optionally, curving the semiconductor chip, already connected at two portions, may then be refined so that more complex configurations may be formed.

In an embodiment, the semiconductor chip is bent so as to be connected with permanent flexural strain. In such a configuration, flexural strain may permanently act on the bent semiconductor chip of the package. The mentioned connection areas of the semiconductor chip may be fixed in place on the respective connected entity. This may avoid any effort in permanently bending semiconductor chips.

However, in an alternative embodiment, the semiconductor chip can also be three-dimensionally curved without permanent flexural strain, so as to be connected in a force free bent state with the connected entities, such as carrier and connection body. A force-free configuration can be created by taking this measure.

In an embodiment, the semiconductor chip is elastically deformed while being connected with the carrier and the connection body. An elastic deformation is characterized by a behaviour of the bent semiconductor chip according to which the bent semiconductor chip moves back into a planar configuration when the flexing or bending stress or force is removed.

However, it is alternatively possible that the bent semiconductor chip is plastically deformed, i.e. remains in the deformed configuration after releasing flexural strain or force.

In an embodiment, the first connection area and the second connection area both form part of the same main surface of the semiconductor chip, in particular both form part of a lower main surface of the semiconductor chip. In such a configuration, the different connection areas are formed on the same main surface of the semiconductor chip, i.e. on its lower main surface or on its upper main surface. It is however alternatively also possible that connection areas are provided at both opposing main surfaces of the bent semiconductor chip, which further increases the freedom of design of a package designer.

In an embodiment, all leads or terminals of the carrier may protrude laterally out of the encapsulant (which may correspond to a leaded package architecture). However, it is also possible that the package is a leadless package.

In an embodiment, a connection between the semiconductor chip and the carrier and/or the connection body/bodies is formed by a connection medium. For instance, the connection medium may be a solder structure, a sinter structure, a welding structure, and/or a glue structure. Thus, mounting the semiconductor chip on the carrier may be accomplished by soldering, sintering or welding, or by adhering or gluing.

In an embodiment, the package comprises a plurality of semiconductor chips mounted on the carrier. Thus, the package may comprise one or more semiconductor chips (for instance at least one passive component, such as a capacitor, and at least one active component, such as a semiconductor chip).

In an embodiment, the at least one semiconductor chip comprises at least one of the group consisting of a controller circuit, a driver circuit, and a power semiconductor circuit. All these circuits may be integrated into one semiconductor chip, or separately in different chips. For instance, a corresponding power semiconductor application may be realized by the chip(s), wherein integrated circuit elements of such a power semiconductor chip may comprise at least one transistor (in particular a MOSFET, metal oxide semiconductor field effect transistor), at least one diode, etc. In particular, circuits fulfilling a half-bridge function, a full-bridge function, etc., may be manufactured.

In an embodiment, the package is configured as a power converter, in particular one of an AC/DC power converter and a DC/DC power converter. However, also other electronic applications, such as inverters, etc. may be possible.

As substrate or wafer for the semiconductor chips, a semiconductor substrate, i.e. a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages will become apparent from the following description and the appended claims, taken in conjunction with the accompanying drawings, in which like parts or elements are denoted by like reference numbers.

The illustration in the drawing is schematic and not to scale.

Before exemplary embodiments will be described in more detail referring to the figures, some general considerations will be summarized based on which exemplary embodiments have been developed.

According to an exemplary embodiment, the flexible nature of a thin semiconductor chip (in particular silicon chip) may be used to overcome a vertical distance between different connection areas of the semiconductor chip with respect to connected entities, such as a carrier and another connection body. By bending or flexing the semiconductor chip, conventional measures for bridging a distance between connected entities at different vertical levels, such as clips or bond wires, may be omitted partially or entirely. As a result, a simpler package design can be obtained, and the manufacturing effort may be significantly reduced.

According to an exemplary embodiment, one contact area of the semiconductor chip may be arranged at a first vertical level and another second contact area of the same semiconductor chip may be arranged at another second vertical level. This may be accomplished by bending the semiconductor chip to or between the mentioned different vertical levels.

In order to promote bendability of the semiconductor chip, it may be made of a sufficiently thin semiconductor material, preferably silicon material, preferably of constant thickness. For instance, such a thickness may be below 50 µm or most preferably at or below 20 µm. Silicon or other semiconductors such as gallium nitride may be particularly appropriate for creating bent semiconductor chips when being sufficiently thin. For example, such semiconductor chips may be connected under permanent elastic flexural strain due to an elastic deformation of the semiconductor chip.

In particular when stacking multiple semiconductor chips on top of each other within a package, a significant space-saving may be achieved by the described manufacturing architecture. Furthermore, shorter connection paths may be created within the package which may result, in turn, in smaller losses and a better signal quality.

Semiconductor packages are constantly being challenged to have physically smaller footprints, reducing occupied printed circuit board (PCB) area allowing smaller, denser products to be realized. Other electrical requirements include a reduction in the drain-source on-resistance (RD-SON), the collector-emitter on-voltage, VCEON value, etc., for more efficient power use. Furthermore, low inductances may be advantageous for certain applications, such as operations in motor drives. Exemplary embodiments may help to address these and/or other physical challenges, and may in particular contribute to an increase in power density.

According to an exemplary embodiment, a package is provided which may for instance be designed in a MOSFET half-bridge configuration. Such a package may comprise at least one sufficiently thin and hence flexible semiconductor chip (in particular a thin die). More specifically, such a package may comprise a (for instance leadframe-type) carrier, a first thin semiconductor chip (such as a first thin die) bonded to the (for instance leadframe-type) carrier, a second electronic component (such as a second die) aligned over the (in particular top-sided) first semiconductor chip. For instance, a top-sided pad (such as a drain pad) may be added to the back side of the second electronic component to establish a top side connection and heat path for the top semiconductor chip. Furthermore, it may be possible to provide a gate on the top-sided semiconductor chip, which may be preferably connected (in particular soldered) to the leadframe. Moreover, a further connection (in particular a gate connection) to the second electronic component may be established (for example via a wire or a clip). Preferably but not necessarily, the described assembly may be encapsulated (in particular overmolded).

An exemplary embodiment utilizes the flexible nature of a semiconductor chip such as a silicon die that has been thinned to about 100 µm or less to improve the in-circuit on-resistance. By flipping one electronic component (such as a semiconductor die) and placing it on top of another (preferably similarly thinned) electronic component (such as other semiconductor die), it may be possible to create an electrical configuration between the two electronic components/semiconductor chips (preferably dies) of very low resistance and induction. Since the electronic components/semiconductor chips may be stacked one on top of another, this may also provide an opportunity for a lower surface area package on a mounting base (such as a printed circuit board). Furthermore, it may also be possible to establish dual sided cooling via the top placed die.

In the case of a MOSFET-type semiconductor chip, in particular a half-bridge configuration can be achieved by joining the electronic components/semiconductor chips in the described way making use of a flexibility of at least one of the electronic components/semiconductor chips. To achieve a corresponding electronic implementation in an IGBT with diode, the diode may have its cathode (in particular corresponding to a base of die) terminal routing out through the top of the die (for instance by providing a flipped field effect transistor).

In order to ensure that no electrical short circuit occurs between the die edge termination structure, a protection and isolation of this area may be advantageous. Additionally, the die front-side-metal (FSM) may be thickened, and one or more metals suitable for soldering together may be implemented advantageously.

In one embodiment, a first die may be bonded to a leadframe. Thereafter, a second die may be aligned over the top of the first die. The thin top die can then flex to meet the same level as the die attach and leadframe of the lower die. A top drain pad may also be added to the back of the second die to provide a top side connection and heat path for the top die. The gate on the top die may also be soldered to an assigned leadframe pad. A gate connection can then be added to the lower die (for example, a wire or clip can be used) before overmolding the assembly. In particular the use of a die to flex for forming a connection on a different plane may be highly advantageous in terms of compactness and performance of the package.

FIG. 1 illustrates a cross-sectional view of a package 100 according to an exemplary embodiment.

The illustrated package 100 comprises a carrier 102. Furthermore, package 100 comprises a semiconductor chip 104 having a first connection area 106 at which the semiconductor chip 104 is mounted at a first vertical level 108 on or above the carrier 102. Moreover, a connection body 110 is provided. The semiconductor chip 104 is bent to thereby be connected at a second connection area 112 of the semiconductor chip 104 at a second vertical level 114, being different from the first vertical level 108, with the connection body 110. As shown, the first connection area 106 and the second connection area 112 both form part of a lower main surface of the semiconductor chip 104.

As shown schematically in FIG. 1, the connection body 110 may comprise an electrically conductive structure 120 (for example a lead, a pad, or a section of a leadframe) or another electronic component 122.

More specifically, the illustrated semiconductor chip 104 may comprise a first planar portion 138 mounted on or above the carrier 102, a second planar portion 140 mounted on the connection body 110, and a slanted and curved portion 142 between the first planar portion 138 and the second planar portion 140.

According to FIG. 1, package 100 has a height profile, as indicated by its curved configuration along a vertical axis 150. A purely mechanical or an electrically conductive connection may be established between carrier 102 and semiconductor chip 104 at first connection area 106 arranged at first vertical level 108, for instance by an electrically conductive connection structure 118 (such as an adhesive or a solder). Correspondingly, second connection area 112 of semiconductor chip 104 arranged at a lower second vertical level 114 may be connected with connection body 110 purely mechanically or also electrically. This may be accomplished by a further electrically conductive connection structure 118, such as an adhesive or solder.

Figure 2:
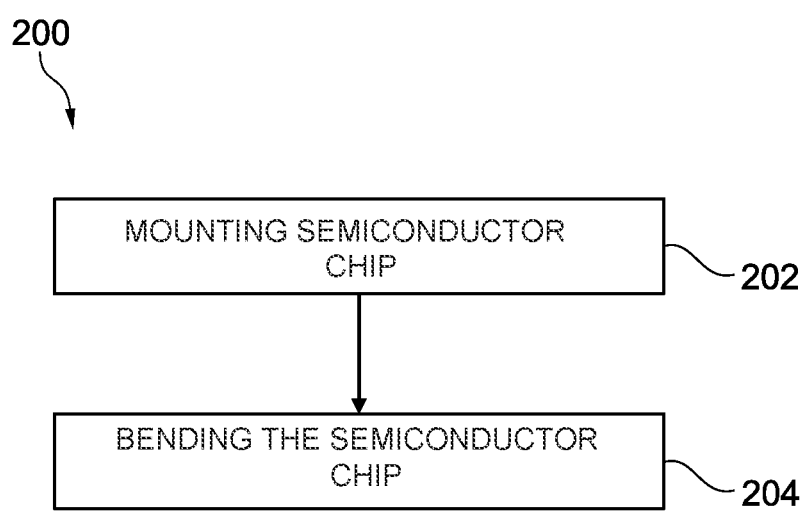
FIG. 2 illustrates a flowchart of a method of manufacturing a package according to an exemplary embodiment.

FIG. 2 illustrates a flowchart 200 of a method of manufacturing a package 100 according to an exemplary embodiment. The reference signs used for the following description of said method of manufacturing package 100 relate to the embodiment of FIG. 1.

As shown by a block 202, the method comprises mounting semiconductor chip 104 having first connection area 106 at first vertical level 108 on or above carrier 102. As illustrated by a block 204, the method further comprises bending the semiconductor chip 104 to thereby connect the semiconductor chip 104 at second connection area 112 of the semiconductor chip 104 at second vertical level 114, being different from the first vertical level 108, with connection body 110.

Referring to FIG. 3 to FIG. 8, further exemplary embodiments of packages 100 according to exemplary embodiments will be explained. In each of FIG. 3 to FIG. 8, a plan view (illustrated on the bottom left-hand side), and two cross-sectional views (illustrated on the top side and on the bottom right-hand side) of the respective package 100 is shown.

Figure 3:
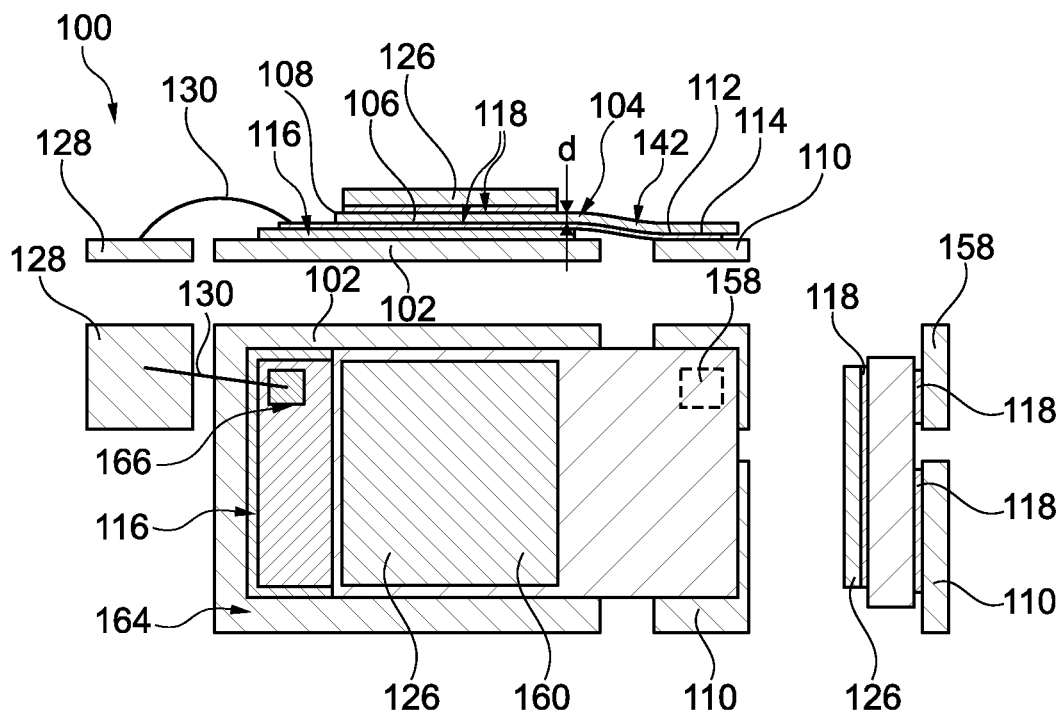
FIG. 3 illustrates different views of a package according to another exemplary embodiment before encapsulation.
Figure 4:
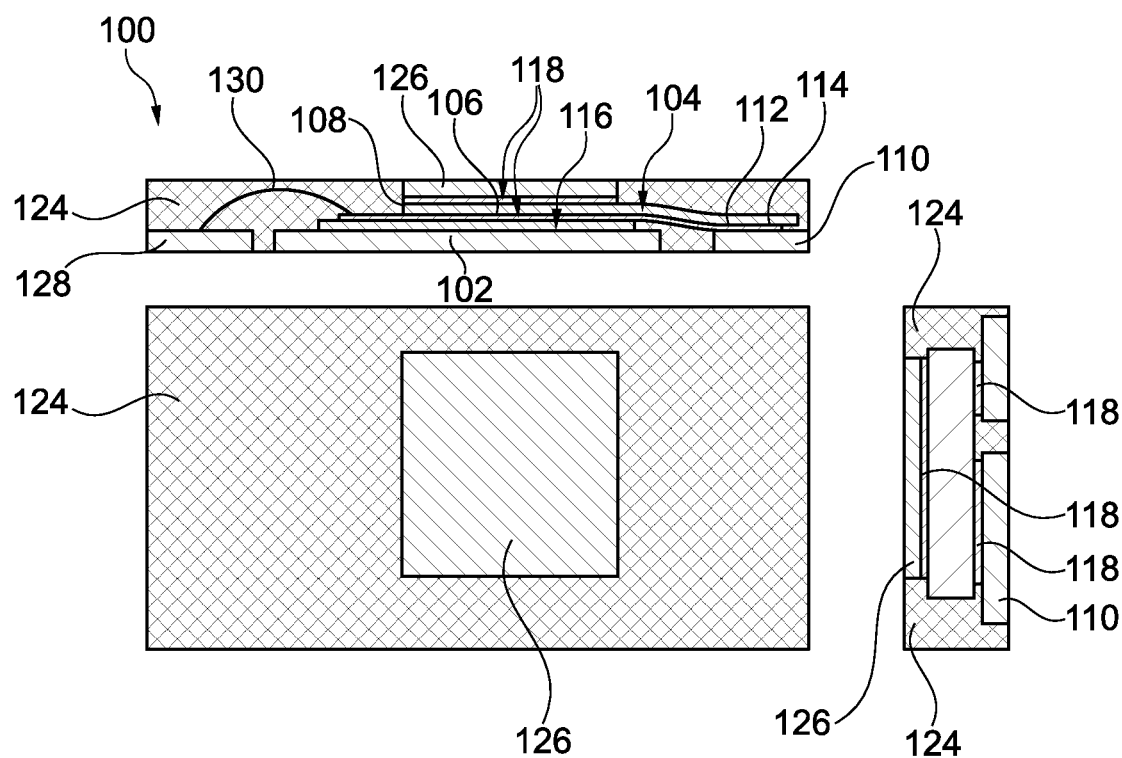
FIG. 4 illustrates the package according to FIG. 3 after encapsulation.

FIG. 3 illustrates different views of a package 100 according to an exemplary embodiment before encapsulation. FIG. 4 illustrates the package 100 according to FIG. 3 after encapsulation.

The illustrated package 100 comprises a carrier 102 which may be embodied as a planar metal sheet. Carrier 102 may form part of a patterned planar metal plate, such as a leadframe. Carrier 102 may for instance be a die pad. For example, carrier 102 is made of copper and/or aluminum.

Moreover, package 100 comprises a semiconductor chip 104, which may be a thin silicon die having a thickness of for example 20 µm. Semiconductor chip 104 may have a first connection area 106 at which the semiconductor chip 104 is mounted at a first vertical level 108 above the carrier 102.

As shown in FIG. 3, a further electronic component 116 (for example a further semiconductor die) may be arranged between the carrier 102 and the semiconductor chip 104, so that components 104, 116 may form a stacked-die configuration. An electrically conductive connection structure 118, such as a solder structure, may be arranged between the semiconductor chip 104 and the further electronic component 116 for mechanically and electrically coupling components 104, 116 with each other. Preferably, the semiconductor chip 104 and the further electronic component 116 are interconnected to form a half-bridge. For this purpose, the semiconductor chip 104 and the further electronic component 116 may both be metal oxide semiconductor field effect transistor (MOSFET) chips.

Beyond this, package 100 comprises an electrically conductive connection body 110, for instance a pad or pin. For instance, connection body 110 may form part of the same structured planar metal plate (in particular leadframe) as carrier 102. As a consequence, connection body 110 may be arranged at the same vertical level as carrier 102. In other words, the carrier 102 and the connection body 110 may be coplanar and may belong to a common leadframe.

Due to the presence of the electronic component 116 vertically between the carrier 102 and the semiconductor chip 104, the first connection area 106 at a lower main surface of the semiconductor chip 104 is located at an elevated vertical level as compared to an upper main surface of the connection body 110. In order to bridge the vertical gap between the semiconductor chip 104 and the connection body 110, the semiconductor chip 104 is bent so as to assume a three-dimensionally curved configuration. Thereby a second connection area 112 of the semiconductor chip 104 at a second vertical level 114, being different from the first vertical level 108, is directly connected with the connection body 110. By said bending or flexing of the thin semiconductor chip 104, the above-mentioned vertical gap may be bridged by the semiconductor chip 104 itself without the need of the clip, a bond wire or the like. This may allow to manufacture package 100 according to FIG. 3 and FIG. 4 in a compact and lightweight manner, as well as with low effort. Moreover, the described direct connection between semiconductor chip 104 and connection body 110 may keep signal paths short, which may result in a low loss and high quality signal transmission.

During manufacturing package 100, the semiconductor chip 104 may be bent into a flexed state and may be fixedly connected with permanent flexural strain at electronic component 116 and connection body 110, respectively. During bending, the semiconductor chip 104 may be elastically deformed while being connected (for instance by soldering) with the electronic component 116 and the connection body 110. In order to promote bendability of the semiconductor chip 104, a chip thickness, d, of the semiconductor chip 104 may be made sufficiently small, preferably below 50 μm, and most preferably at or below 20 μm.

As shown in FIG. 4, package 100 may comprise an encapsulant 124 encapsulating the semiconductor chip 104, part of the carrier 102, and part of connection body 110. Encapsulant 124 may for instance be a mold-type encapsulant. Encapsulation may be carried out by overmolding. Since the semiconductor chip 104 may be connected to the top side of the further electronic component 116 as well as to a top side of the connection body 110 by soldering or the like, the preferably elastically bent semiconductor chip 104 may be connected both to the further electronic component 116 and to the connection body 110 under permanent tension. Encapsulating the bent semiconductor chip 104 by a mold-type encapsulant 124 may be highly advantageous for mechanically stabilizing the bent semiconductor chip 104 in the desired illustrated bent state. This may improve the mechanical and electrical reliability and thus the performance of the package 100.

As shown in FIG. 3 and FIG. 4 as well, a heat removal body 126 is mounted on top of the semiconductor chip 104. For instance, the heat removal body 126 may be a metal sheet or layer. In particular, the heat removal body 126 may be a metal block, such as a copper block. The heat removal body 126 may be made of a material having a high thermal conductivity (for instance at least 50 W/mK). As shown in FIG. 4, an upper main surface of the heat removal body 126 is exposed with respect to the encapsulant 124 at an upper main surface of the package 100 for promoting top side cooling. During operation of the package 100, the semiconductor chips 104, 116 may create a considerable amount of heat which may be removed out of the package 100 at least partially by the heat removal body 126 on a top side.

As shown, also a lower main surface of the carrier 102 and a lower main surface of the connection body 110 are exposed with respect to the encapsulant 124. Hence, both carrier 102 and connection body 110 may also contribute to heat removal from the package 100 at a bottom side. Hence, double sided cooling of package 100 may be accomplished by cooperation of heat removal body 126, carrier 102 and connection body 110. Apart from this, the exposed surfaces of carrier 102 and connection body 110 may function as electric terminals of package 100 for connecting electronic components/semiconductor chips 104, 116 to an electronic periphery of the package 100 (for instance to a printed circuit board on which package 100 may be mounted for instance by soldering, not shown).

As shown in FIG. 3 and FIG. 4, package 100 comprises a further connection body 128 connected with the semiconductor chip 104 via solder material. For instance, the further connection body 128 may be a further pad or pin. It is possible that further connection body 128 may form part of the same structured planar metal plate (in particular leadframe) as carrier 102 and connection body 110. As a consequence, further connection body 128 may be arranged at the same vertical level as carrier 102 and connection body 110. In other words, the carrier 102, the connection body 110 and the further connection body 128 are coplanar and may belong to a common leadframe.

Still referring to further connection body 128, an electrically conductive connection element 130 (such as a bond wire, which may be denoted as gate wire) may be provided for connecting the further connection body 128 with the semiconductor chip 104, via solder material.

As already mentioned, the package 100 shown in FIG. 3 and FIG. 4 comprises the two electronic components/semiconductor chips 104, 116 which may be configured as thin die MOSFETs connected in a half-bridge configuration. The lower electronic component 116 and the upper semiconductor chip 104 may be connected by soldering at a front side metal to establish a die-to-die connection. The upper semiconductor chip 104 is a MOSFET die being bent to touch additionally also connection body 110 which is here configured as a leadframe pad.

More specifically, said connection body 110 may constitute a source pad. With reference sign 158, FIG. 3 also shows a gate pad on upper semiconductor chip 104. As indicated with reference sign 160, a drain pad may be soldered onto a back side of the semiconductor chip 104. Correspondingly, a further drain pad 164 and a further gate pad 166 are indicated as well.

FIG. 4 shows the package 100 of FIG. 3 after encapsulation by a mold compound. In other words, the thin die MOSFETs in half-bridge configuration may be overmolded with encapsulant 124. FIG. 4 shows as well as a top side cooling connection in form of the heat removal body 126 being exposed beyond the encapsulant 124.

Figure 5:
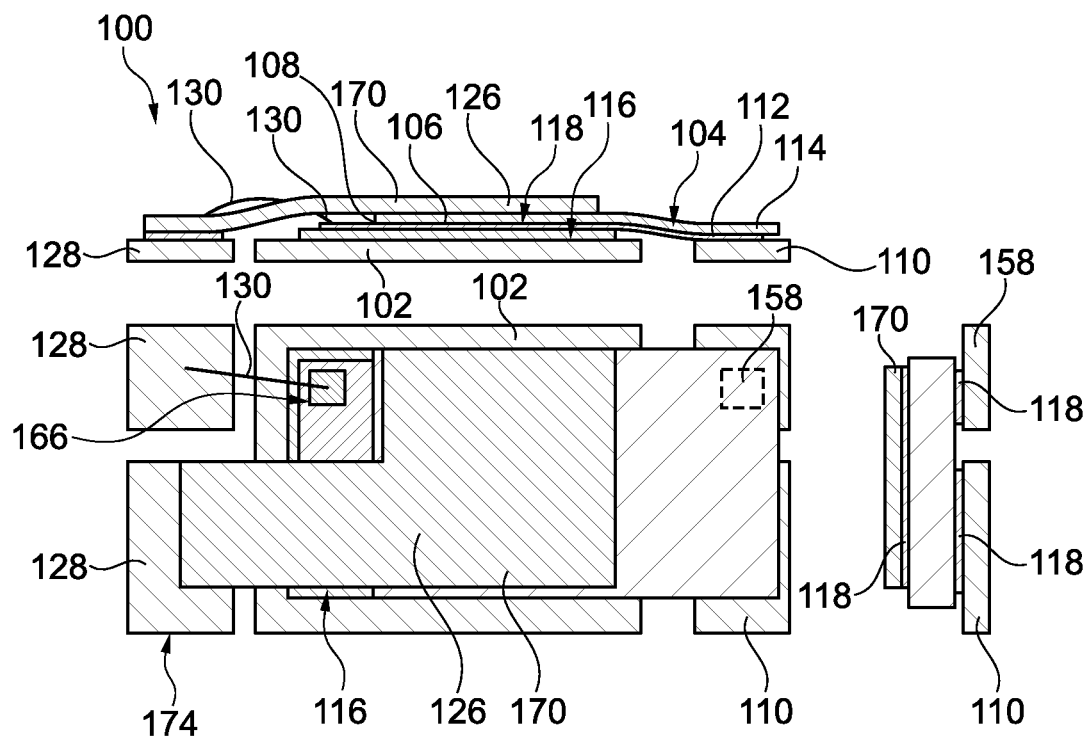
FIG. 5 illustrates different views of a package according to another exemplary embodiment before encapsulation.
Figure 6:
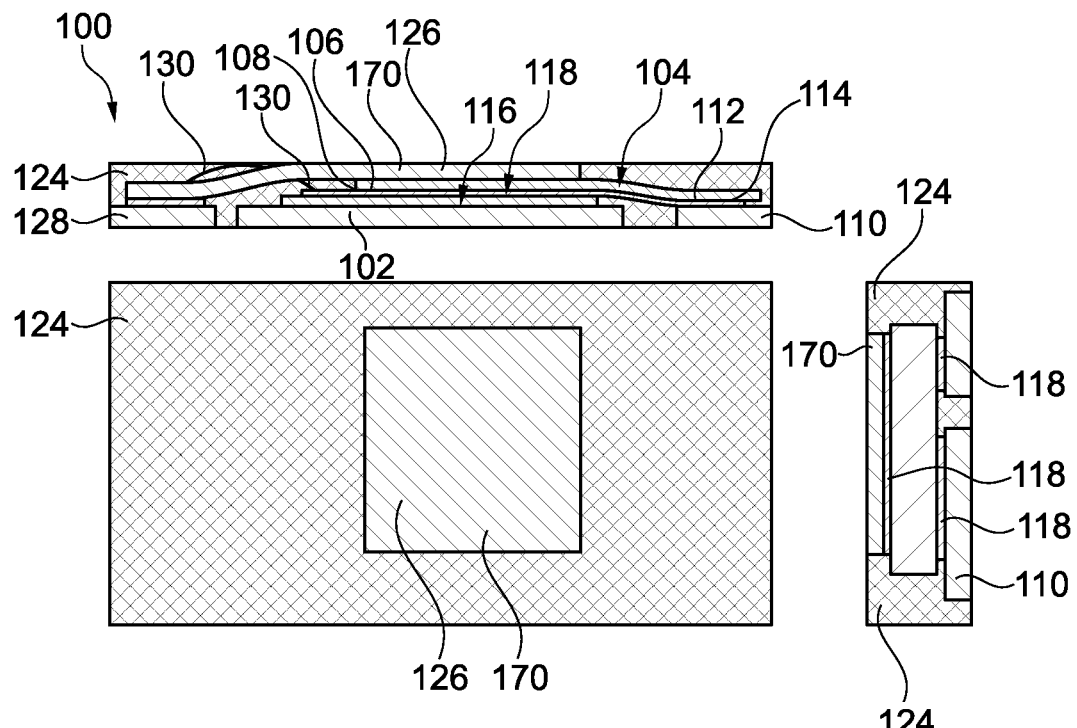
FIG. 6 illustrates the package according to FIG. 5 after encapsulation.

FIG. 5 illustrates different views of a package 100 according to another exemplary embodiment before encapsulation. FIG. 6 illustrates the package 100 according to FIG. 5 after encapsulation.

According to FIG. 5 and FIG. 6, the heat removal body 126 not only removes heat from semiconductor chip 104, but fulfils the additional function of electrically coupling the further connection body 128 with a top-side terminal of the semiconductor chip 104. For this purpose, the heat removal body 126 of FIG. 5 and FIG. 6 is embodied as a clip 170, i.e. as a three-dimensional bent metal plate.

Moreover, the embodiment of FIG. 5 and FIG. 6 differs from the embodiment of FIG. 3 and FIG. 4 in particular in that the thin die MOSFETs connected in half-bridge configuration have an alternative drain pad connection architecture according to FIG. 5 and FIG. 6. The mentioned clip 170 may also have a drain pad connection function, see reference sign 174 and may thus be denoted as drain pad clip. As best seen in FIG. 6, an upper main surface of the clip 170 is exposed beyond the encapsulant 124 after encapsulation, thereby forming a top side cooling design.

Figure 7:
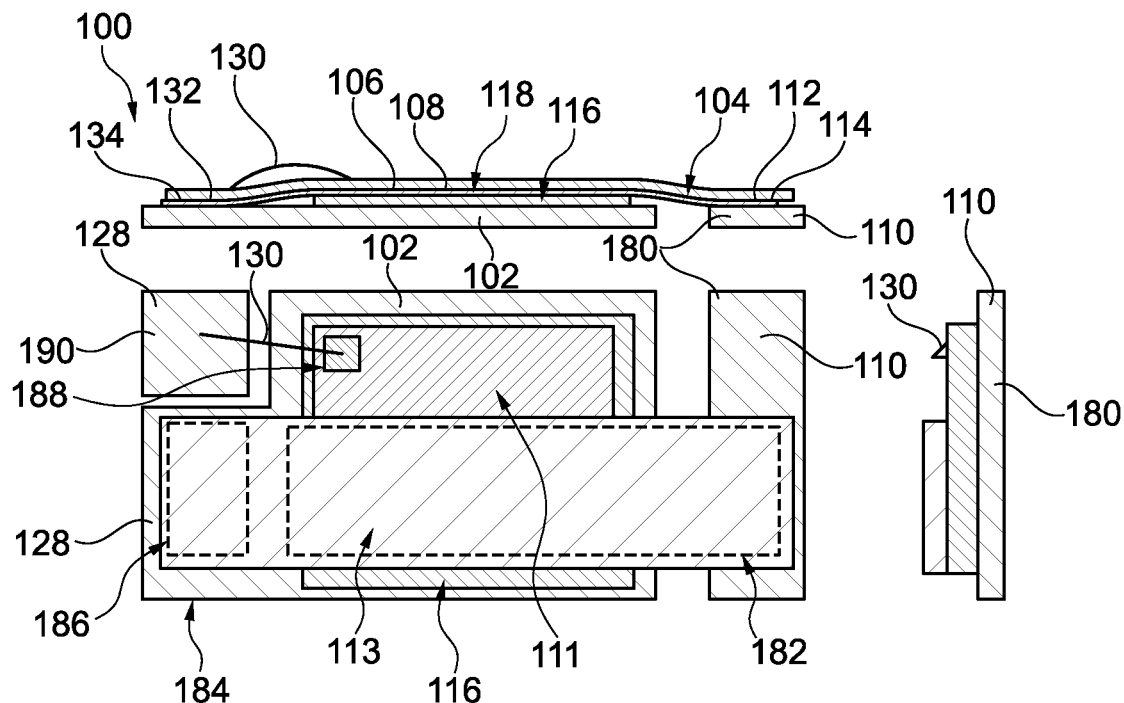
FIG. 7 illustrates different views of a package according to another exemplary embodiment before encapsulation.
Figure 8:
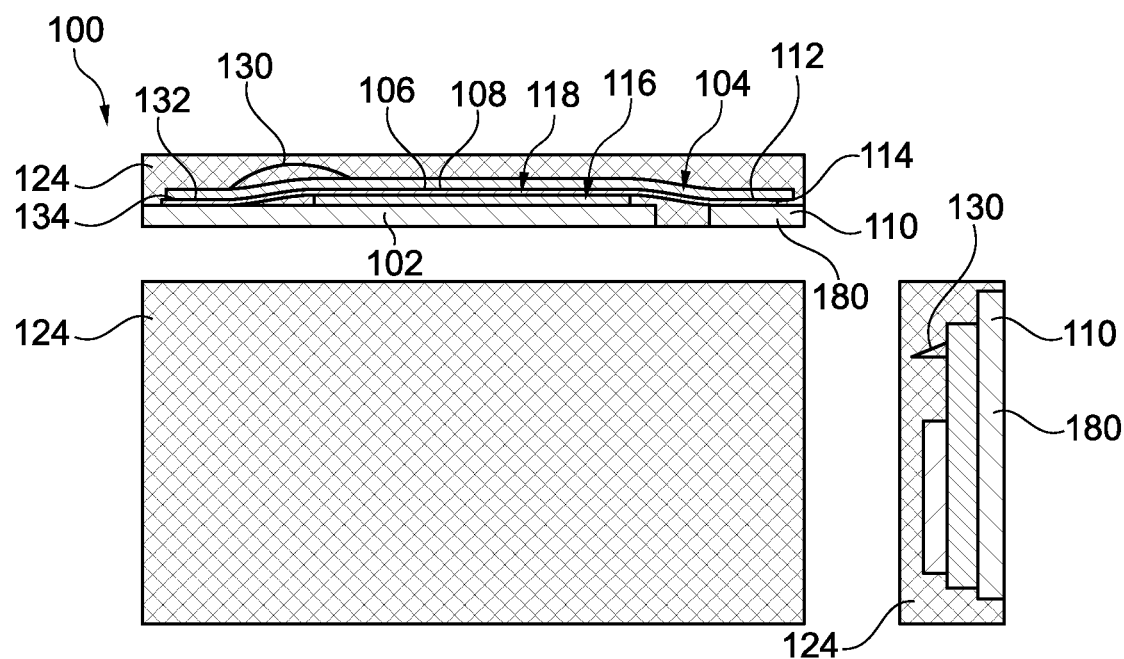
FIG. 8 illustrates the package according to FIG. 7 after encapsulation.

FIG. 7 illustrates different views of a package 100 according to another exemplary embodiment before encapsulation. FIG. 8 illustrates the package 100 according to FIG. 7 after encapsulation.

According to FIG. 7 and FIG. 8, the semiconductor chip 104 is bent at both opposing end portions thereof with respect to its central portion to thereby be connected at a third connection area 132 of the semiconductor chip 104 at a third vertical level 134 with further connection body 128. In the shown embodiment, the third vertical level 134 is different from (more specifically lower than) the first vertical level 108 and is identical to the second vertical level 114 (alternatively, the third vertical level 134 may also be different from the second vertical level 114, not shown).

According to a FIG. 7 and FIG. 8, one of the semiconductor chip 104 and the further electronic component 116 may be an insulated gate bipolar transistor chip (IGBT, see reference sign 111), and the other one of the semiconductor chip 104 and the further electronic component 116 may be a diode chip (see reference sign 113). Referring to the embodiment of FIG. 7 and FIG. 8 in further detail, the IGBT 111 in form of electronic component 116 can be initially bonded to a leadframe collector or cathode pad. The diode chip 113 (corresponding to semiconductor chip 104) containing a front side exit for the cathode terminal can then be laid over the top of the IGBT die so that the flexible nature of its thin silicon may then provide a connection to the leadframe at the same vertical level as the IGBT die attach. A gate connection can then be added to the IGBT 111, and the assembly may be encapsulated for instance by molding. Thus, the configuration of FIG. 7 and FIG. 8 shows a thin die IGBT and FRED (fast-recovery epitaxial diode) configuration, wherein the FRED has its cathode set out through the top side.

The embodiment of FIG. 7 and FIG. 8 differs from the embodiment of FIG. 3 to FIG. 6 not only by the combination of a bipolar transistor and a diode (rather than the combination of two MOSFETs), but additionally by the fact that, according to FIG. 7 and FIG. 8, the upper semiconductor chip 104 comprises two bent sections. By these two bent, curved or flexed sections, the package 100 provides three connections at various vertical levels, more specifically an elevated vertical level between two lower (and for instance identical) vertical levels.

More specifically, FIG. 7 and FIG. 8 show an electrically conductive connection element 130 (such as a bond wire, here embodied as a gate wire) and an emitter/anode leadframe pad 180. Reference sign 182 denotes an anode area on the diode. Reference sign 184 shows a collector/cathode leadframe pad, and reference sign 186 shows a cathode area on the pad. An IGBT gate pad is denoted with reference sign 188, and a gate leadframe pad with reference sign 190. As shown, the upper semiconductor chip 104 is bent to touch leadframe pads at both ends.

It should be noted that the term "comprising" does not exclude other elements or features and the "a" or "an" does not exclude a plurality. Also, elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package, which comprises:
a carrier;
a semiconductor chip having a first connection area at which the semiconductor chip is mounted at a first vertical level on or above the carrier; and
a connection body;
wherein the semiconductor chip is bent to thereby be connected at a second connection area of the semiconductor chip at a second vertical level, being different from the first vertical level, with the connection body;
wherein the semiconductor chip comprises a first planar portion mounted on or above the carrier, a second planar portion mounted on the connection body, and a slanted and/or curved portion between the first planar portion and the second planar portion, and
wherein the first planar portion is parallel to the second planar portion.

2. The package according to claim 1, comprising a further electronic component arranged between the carrier and the semiconductor chip.

3. The package according to claim 2, comprising at least one of the following features:
the further electronic component is an active semiconductor component, in particular one of a transistor, a diode, a bipolar transistor, and an insulated gate bipolar transistor;
the package comprises an electrically conductive connection structure, in particular a solder structure, between the semiconductor chip and the further electronic component, in particular for electrically coupling pads of the semiconductor chip and of the further electronic component;
wherein the semiconductor chip and the further electronic component are interconnected to form a half-bridge;
the semiconductor chip and the further electronic component are transistor chips, in particular metal oxide semiconductor field effect transistor chips; or
one of the semiconductor chip and the further electronic component is a transistor chip, in particular an insulated gate bipolar transistor chip, and the other one of the semiconductor chip and the further electronic component is a diode chip.

4. The package according to claim 1, comprising one of the following features:
wherein the connection body comprises an electrically conductive structure, in particular one of a lead, a pad, and a section of a leadframe; and
wherein the connection body comprises yet another electronic component.

5. The package according to claim 1, comprising at least one of the following features:
wherein a thickness (d) of the bent semiconductor chip is below 20 µm;
wherein the semiconductor chip is one of a silicon chip, a silicon carbide chip, or a gallium nitride chip; and
wherein the semiconductor chip is an active semiconductor component, in particular one of a transistor, a diode, a bipolar transistor, and an insulated gate bipolar transistor.

6. The package according to claim 1, wherein the carrier and the connection body are coplanar.

7. The package according to claim 1, wherein the carrier and the connection body belong to a common leadframe.

8. The package according to claim 1, comprising an encapsulant encapsulating at least part of the semiconductor chip, at least part of the carrier, and at least part of connection body.

9. The package according to claim 8, comprising a heat removal body on the semiconductor chip and being exposed with respect to the encapsulant.

10. The package according to claim 8, wherein at least one of the carrier and the connection body is exposed with respect to the encapsulant.

11. The package according to claim 1, comprising a further connection body connected with the semiconductor chip.

12. The package according to claim 11, comprising an electrically conductive connection element, in particular a bond wire, a bond ribbon or a clip, connecting the further connection body with the semiconductor chip.

13. The package according to claim 11, wherein the semiconductor chip is additionally bent to thereby be connected at a third connection area of the semiconductor chip at a third vertical level with the further connection body.

14. The package according to claim 13, comprising one of the following features:

the third vertical level is different from the first vertical level and is different from the second vertical level;
the third vertical level is identical to one of the first vertical level and the second vertical level.

15. The package according to claim 9, wherein the heat removal body connects a further connection body with the semiconductor chip.

16. The package according to claim 1, wherein the semiconductor chip is bent so as to be connected between the carrier and the connection body with permanent flexural strain.

17. The package according to claim 1, wherein the semiconductor chip is elastically deformed in its state connected with the carrier and with the connection body.

18. The package according to claim 1, wherein the first connection area and the second connection area both form part of the same main surface of the semiconductor chip, in particular both form part of a lower main surface of the semiconductor chip.

* * * * *